(12) United States Patent
Robin et al.

(10) Patent No.: US 8,232,560 B2
(45) Date of Patent: Jul. 31, 2012

(54) LIGHT-EMITTING DIODE IN SEMICONDUCTOR MATERIAL

(75) Inventors: Ivan-Christophe Robin, Grenoble (FR); Pierre Ferret, Grenoble (FR); Johan Rothman, Lans En Vercors (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/503,248

(22) Filed: Jul. 15, 2009

(65) Prior Publication Data
US 2010/0025654 A1 Feb. 4, 2010

(30) Foreign Application Priority Data

Jul. 31, 2008 (FR) ...................................... 08 55272

(51) Int. Cl.
| H01L 27/15 | (2006.01) |
|---|---|
| H01L 29/26 | (2006.01) |
| H01L 31/12 | (2006.01) |
| H01L 33/00 | (2010.01) |
| H01L 29/06 | (2006.01) |
| H01L 29/12 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/22 | (2006.01) |
| H01L 29/739 | (2006.01) |

(52) U.S. Cl. ................ 257/79; 257/10; 257/13; 257/94; 257/99; 257/101; 257/102; 257/103; 257/192; 257/194; 257/195; 257/918; 257/E33.052; 257/E33.053

(58) Field of Classification Search .................... 257/13, 257/79, 103, 192, 194, 195, 918, E33.052, 257/E33.053, 94, 99, 101, 102, 10
See application file for complete search history.

(56) References Cited

U.S. PATENT DOCUMENTS

| 3,922,571 | A | * | 11/1975 | Smith | ........................... 327/530 |
|---|---|---|---|---|---|
| 4,112,316 | A | * | 9/1978 | Wentz | ........................... 327/566 |
| 5,247,193 | A | * | 9/1993 | Menda | ............................. 257/85 |
| 5,256,888 | A | * | 10/1993 | Kane | ............................... 257/77 |
| 5,272,365 | A | * | 12/1993 | Nakagawa | .................... 257/194 |
| 5,294,818 | A | * | 3/1994 | Fujita et al. | ................... 257/289 |
| 5,343,057 | A | * | 8/1994 | Gerard et al. | ................. 257/192 |
| 5,367,177 | A | * | 11/1994 | Taylor et al. | .................... 257/20 |

(Continued)

OTHER PUBLICATIONS

Atsushi Tsukazaki, et al., "Blue Light-Emitting Diode Based on ZnO", Japanese Journal of Applied Physics, vol. 44, No. 21, XP-002520857, 2005, pp. L643-L645.

(Continued)

*Primary Examiner* — Ida M Soward
(74) *Attorney, Agent, or Firm* — Oblon, Spivak, McClelland, Maier & Neustadt, L.L.P.

(57) ABSTRACT

A light-emitting diode including: a structure in a semiconductor material of first conductivity type, wherein the structure has a first face of which a first region is in contact with a pad of semiconductor material having a second conductivity type opposite the first conductivity type, and the diode further includes a first electric contact on the pad, a second electric contact-on the first face or on a second face of the structure, and a gate in electrically conductive material arranged on a second region of the first face and separated from the first face by an electrically insulating layer.

17 Claims, 2 Drawing Sheets

U.S. PATENT DOCUMENTS

| | | | | |
|---|---|---|---|---|
| 5,391,895 | A * | 2/1995 | Dreifus | 257/77 |
| 5,670,788 | A * | 9/1997 | Geis | 257/10 |
| 5,780,318 | A * | 7/1998 | Hirano et al. | 438/20 |
| 5,877,518 | A * | 3/1999 | Sakurai et al. | 257/139 |
| 5,920,086 | A * | 7/1999 | MacFarlane et al. | 257/103 |
| 6,353,236 | B1 * | 3/2002 | Yatsuo et al. | 257/77 |
| 6,495,409 | B1 * | 12/2002 | Manfra et al. | 438/216 |
| 6,541,824 | B2 * | 4/2003 | Lee et al. | 257/355 |
| 6,580,125 | B2 * | 6/2003 | Kitabatake et al. | 257/335 |
| 6,753,562 | B1 * | 6/2004 | Hsu et al. | 257/295 |
| 6,818,915 | B1 * | 11/2004 | Koga | 257/10 |
| 6,828,605 | B2 * | 12/2004 | Eisele et al. | 257/213 |
| 6,864,533 | B2 * | 3/2005 | Yasuhara et al. | 257/342 |
| 6,963,091 | B1 * | 11/2005 | Vashchenko et al. | 257/213 |
| 7,061,014 | B2 * | 6/2006 | Hosono et al. | 257/43 |
| 7,061,027 | B2 * | 6/2006 | Tanaka et al. | 257/192 |
| 7,157,741 | B2 * | 1/2007 | Kim et al. | 257/80 |
| 7,187,014 | B2 * | 3/2007 | Hirose et al. | 257/192 |
| 7,268,361 | B2 * | 9/2007 | Adamec et al. | 257/10 |
| 7,364,988 | B2 * | 4/2008 | Harris et al. | 438/478 |
| 7,569,871 | B2 * | 8/2009 | Nagy et al. | 257/192 |
| 7,671,448 | B2 * | 3/2010 | Furukawa et al. | 257/642 |
| 7,854,861 | B2 * | 12/2010 | Li et al. | 252/502 |
| 2004/0026702 | A1 | 2/2004 | Yamada et al. | 257/80 |
| 2004/0079989 | A1 * | 4/2004 | Kaneko et al. | 257/328 |
| 2004/0129949 | A1 * | 7/2004 | Deliwala et al. | 257/194 |
| 2004/0217375 | A1 * | 11/2004 | Yokogawa et al. | 257/192 |
| 2006/0022217 | A1 * | 2/2006 | Passlack | 257/192 |
| 2007/0063185 | A1 * | 3/2007 | Rao | 257/18 |
| 2008/0185580 | A1 * | 8/2008 | Kato et al. | 257/43 |
| 2009/0250780 | A1 * | 10/2009 | Kurfiss | 257/443 |
| 2011/0042773 | A1 * | 2/2011 | Kurfiss et al. | 257/443 |

OTHER PUBLICATIONS

Sergey Sadofev, et al., "Uniform and Efficient UV-emitting ZnO/ZnMgO Multiple Quantum Wells Grown by Radical-source Molecular Beam Epitaxy", Japanese Journal of Applied Physics, vol. 45, No. 47, XP-002510404, 2006, pp. L1250-L1252.

W. Götz, et al., "Activation of acceptors in Mg-doped GaN grown by metalorganic chemical vapor deposition", Appl. Phys. Lett., vol. 68, No. 5, XP-002520858, Jan. 29, 1996, pp. 667-669.

Satoshi Koizumi, et al., "Ultraviolet Emission from a Diamond pn Junction", Science, vol. 292, XP-002520859, Jun. 8, 2001, pp. 1899-1901.

* cited by examiner

LIGHT-EMITTING DIODE IN SEMICONDUCTOR MATERIAL

TECHNICAL AREA

The invention relates to a light-emitting diode in semiconductor material. It particularly concerns light-emitting diodes containing zinc oxide (ZnO) or gallium nitride (GaN). It also relates to the method for fabrication thereof.

STATE OF THE PRIOR ART

A Light-Emitting Diode, or LED, is an electronic component capable of emitting light when an electric current passes through it. LEDs can be found which emit white light, coloured light, infrared light or light lying in the ultra-violet range (UV). When a LED is polarized directionally, the recombination of electrons and holes in the semiconductor material of the diode causes the emission of photons.

ZnO is a material offering numerous advantages for the obtaining of emission in the UV region at ambient temperature. This is due to its band gap energy of 3.2 eV at ambient temperature and to its binding energy of 60 meV, much higher than thermal energy of 2.5 meV at ambient temperature. However, the factor currently limiting the production of LEDs from ZnO is the obtaining of p-doped ZnO, needed to obtain a diode.

GaN-based materials (GaN, GaInN, GaAlN) or nitrides are the materials currently used commercially to produce LEDs in the blue and UV regions. The band gap energy of GaN, 3.42 eV at ambient temperature, effectively allows UV emission to be obtained. However, diodes are chiefly made from GaInN alloys emitting in the blue. Compared with ZnO, the binding energy of the exciton is weaker, in the order of 30 meV, which is an intrinsic limitation of the material with respect to obtaining good light-emitting yield at ambient temperature.

The technique currently used to produce LEDs containing a semiconductor material consists of forming a p/n junction, which amounts to contacting a p-type material with an n-type material. A depletion region is therefore obtained at the junction. It is then possible to cause a current to pass in the obtained structure, and to cause radiative recombination of the charges at the depletion region. This is the technique which is currently used to produce GaN-based light-emitting diodes for example. GaN is naturally of n-type but it can be p-doped using magnesium doping. In this respect, reference may be made to the following articles:

T. TANAKA et al., Appl. Phys. Lett. 65, 593 (1994), and
W. GOTZ et al., Appl. Phys. Lett. 68, 667 (1996).

GaN and GaAlN of p-type with acceptor concentrations in the order $8.10^{20}/cm^3$ and mobility values in the order of 15 $cm^2/V.s$ can be obtained (see the article by J. D. THOMSON et al., J. Appl. Phys. 99, 024507 (2006)).

It is possible to produce p/n junctions for the manufacture of GaN-based LEDs emitting in the UV. In this respect, reference may be made to the above-cited article by J. D. THOMSON and to S. NAKAMURA et al., Appl. Phys. Lett. 67, 1868 (1995).

ZnO is also naturally of n-type, irrespective of the growth technique used. Research has been conducted to fabricate p-type ZnO, but acceptor concentration and hole mobility are very weak. At the present time, it has not yet been possible to obtain intense electroluminescence in the blue or UV regions using ZnO.

DESCRIPTION OF THE INVENTION

The present invention is designed to allow by-passing of the problem related to ZnO p-doping, by inverting dope type in a region of a ZnO structure using a gate. This technique can be applied to any semiconductor material to cause light emission, in particular to materials such as ZnO, GaN, GaAs. It can be used to fabricate LED matrices of micrometric size that are easily addressable, for display purposes for example, each LED of the matrix forming a picture element or pixel.

One first subject of the invention is a light-emitting diode comprising a structure in semiconductor material having a first conductivity type, and means for electric polarisation of the diode, characterized in that:
the structure has a first face of which a first region is in contact with a pad in semiconductor material having a second type of conductivity opposite the first conductivity type,
the polarising means comprise:
an electric contact on the pad,
an electric contact on the first face or on a second face of the structure,
a gate in electrically conductive material arranged on a second region of the first face and separated from the first face by an electrically insulating layer.

According to one particular embodiment, the gate is a disc having a central hole surrounding said pad.

The pad in semiconductor material may be housed in a cavity formed from the first face of the structure.

The semiconductor material of a first type of conductivity may be chosen from among ZnO, GaN and GaAs. In this case, the semiconductor material of the pad can be chosen from among ZnO, GaN, GaInN, GaAs and GaInAs.

The semiconductor material of first conductivity type may be diamond. In this case, the semiconductor material of the pad may be chosen from among MgO, ZnO and ZnMgO.

The gate may be in a material chosen from among metals and metal alloys. Preferably, the metal is chosen from among gold, copper and platinum.

The electrically insulating layer may be in $SiO_2$.

The electric contacts may be in a material chosen from among gold, copper and platinum.

According to another embodiment, the structure in semiconductor material is a quantum well structure. The structure in semiconductor material may be in ZnMgO with a quantum well in ZnO. The polarization means may be such that they allow the quantum well to be placed at the p/n junction of the diode when the diode is polarized.

A second subject of the method is a method for fabricating a light-emitting diode from a structure in semiconductor material of first conductivity type, comprising:
the forming, in a first region of a first face of the structure, of a pad in semiconductor material having a second conductivity type opposite the first conductivity type,
the forming of diode polarizing means, comprising:
forming an electric contact on the pad,
forming an electric contact on the first face or on a second face of the structure,
forming a gate in electrically conductive material arranged on a second region of the first face and separated from the first face by an electrically insulating layer.

The invention applies to any semiconductor structure to produce light emission (ZnO, GaN, GaAs, etc. . . . It can be used to produce LED matrices of micrometric size that are easily addressable for display purposes for example, each LED of the matrix being a picture element or pixel.

BRIEF DESCRIPTION OF THE DRAWINGS

The invention will be better understood and other advantages and aspects will become apparent on reading the fol

DETAILED DESCRIPTION OF PARTICULAR EMBODIMENTS

Figure 1A:
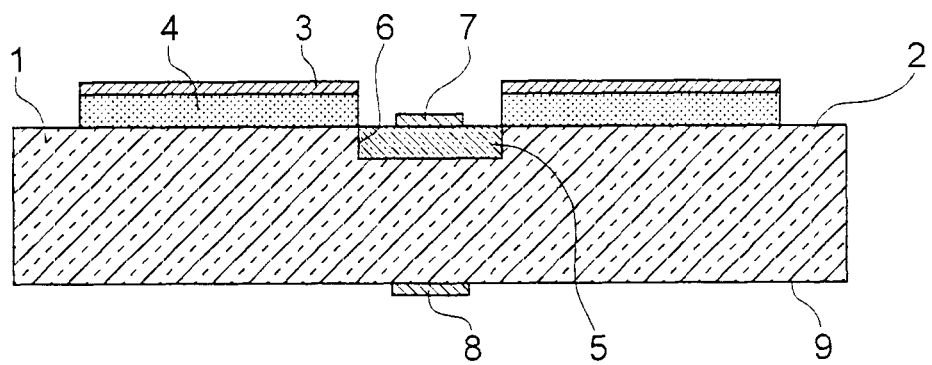
- FIGS. 1A and 1B are cross-sectional and overhead views respectively of a light-emitting diode according to the invention.
Figure 1B:
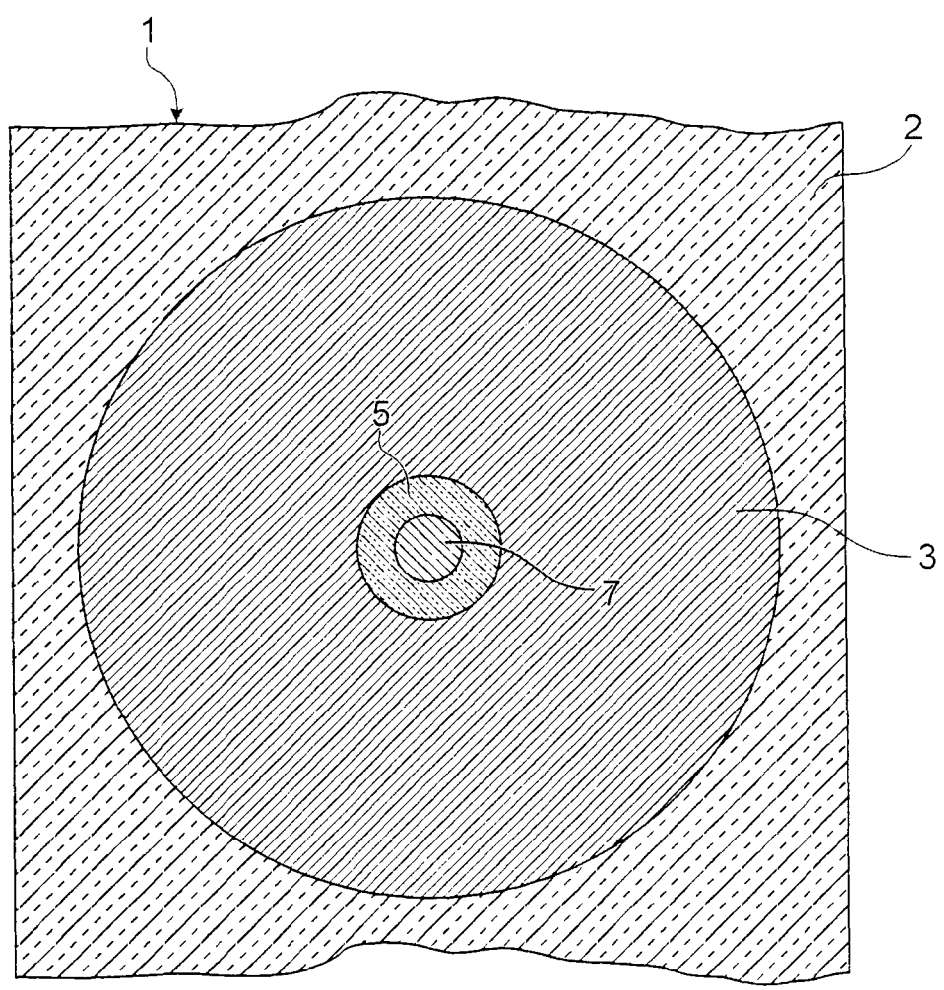

FIGS. 1A and 1B are cross-sectional and overhead views respectively of a light-emitting diode conforming to the invention.

The diode comprises a structure 1 in semiconductor material having a first type of conductivity. On a first face 2 of the structure 1, a gate 3 has been formed in electrically conductive material, the gate 3 being separated from face 2 by a layer of material 4 that is electrically insulating. In this example of embodiment, the gate 3 and the layer 4 are disc-shaped with a common central hole. The common central hole exposes a pad 5 in semiconductor material having a second type of conductivity opposite the first conductivity type. For example, the material of structure 1 is n-type ZnO and the material of pad 5 is p-type doped ZnO by ion implantation.

The pad 5 is housed in a cavity 6 of the structure 1, formed from the first face 2.

Electric connections are formed on the diode obtained. They comprise a connection with the gate 3, a contact 7 arranged on the pad 5 and a contact 8 arranged on a second face 9 of the structure opposite the first face 2. As a variant, the contact 8 may be arranged on the first face 2 of the structure.

By way of example, the thickness of the structure 1 may range from 100 nm to 50 µm, the thickness of the electrically insulating layer 4 may lie between 30 nm and 70 nm. If the gate 3 is a disc pierced in its centre, the disc diameter may vary between a fraction of µm and a few mm. The diameter of the central hole of the disc and the diameter of the cavity 6 may vary between a few hundred nanometers and 1 µm.

The semiconductor material of the structure 1 may be of n-type, in which case the semiconductor material of the pad 5 is of p-type. Conversely, if the semiconductor material of the structure 1 is of p-type, the semiconductor material of the pad is of n-type.

For example, structures 1 in ZnO of n-type are fabricated from a ZnO wafer. A layer of electrically insulating material is formed on face 2 of the structure 1. This may be a $SiO_2$ layer for example, deposited by cathode sputtering. A layer of electrically conductive material e.g. a layer of gold deposited by cathode sputtering is formed on the layer of electrically insulating material. The insulating layer and the conductive layer are then lithographed and etched by Reactive Ion Etching (RIE) to give them a centre-pierced disc shape. Lithography may use nanometric spheres 100 to 200 nm in diameter.

The cavity 6 is then etched by reactive ion etching, the conductive layer and the insulating layer forming an etching mask. Next, in cavity 6, the pad 5 of p-type semiconductor material is deposited by organometallic growth, electrolysis or molecular beam epitaxy, if the material of the pad 5 is of different type to the material of the structure 1. It is also possible to form the pad 5 of p-type semiconductor material, in the cavity 6, by ion implantation or dopant diffusion in the material of the structure 1.

Next, contact 7 is formed on the pad 5 and contact 8 on face 9 by deposit and lift-off, or by deposit and etching.

The p-type semiconductor material of the pad 5 has a band gap energy close to that of ZnO. Its doping level must not necessarily be very high, neither must hole mobility necessarily be very high. This p-type material solely allows the use of a p-type contact and the injection of holes in the inverting region which will be created by applying a negative voltage as illustrated FIG. 2.

Figure 2:
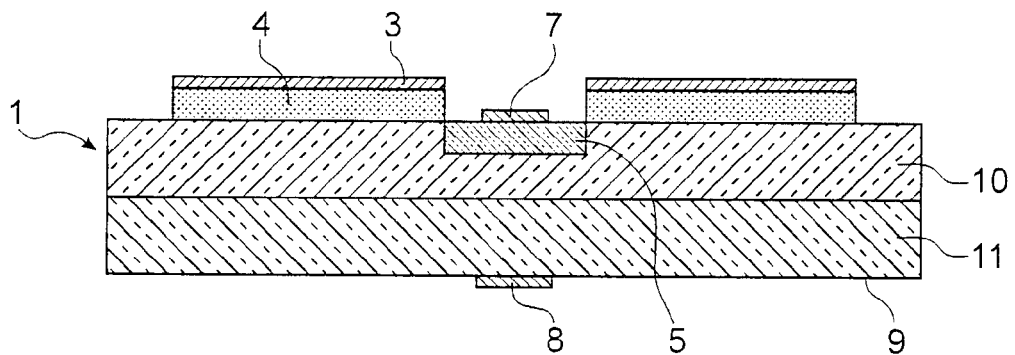
FIG. 2 illustrates the functioning of a first light-emitting diode according to the invention.

FIG. 2 illustrates the functioning of a diode produced in this way. By applying a negative voltage to the gate, of around −10 V relative to the potential of the structure 1 as imposed by the electrode 8, a <<p/n pseudo-junction>> is obtained. By passing a current through the structure via contact p (contact 7) and contact n (contact 8), holes can be injected into region 10 of p-type and electrons injected into region 11 of n-type, thereby obtaining electroluminescence. Lighting of the diode can be controlled by the voltage applied to the gate. The invention applies to any type of semiconductor material, whether an intrinsically n-doped material or a material which can easily be n-doped but cannot easily be p-doped (ZnO, GaN, . . . ) or a material that is easily p-doped but difficult to n-dope (such as diamond for example).

Figure 3:
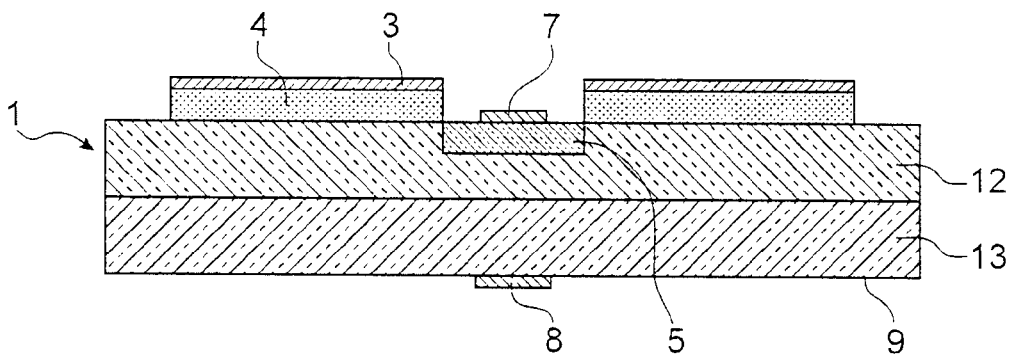
FIG. 3 illustrates the functioning of a second light-emitting diode according to the invention.

With a material that is easily p-doped but is difficult to n-dope, such as diamond, it is necessary to deposit n-type semiconductor material in the gate opening, even if the material is weakly doped with weak electron mobility, and to apply a positive voltage to the gate around 10 V relative to the potential of the structure 1 imposed by the electrode 8, to invert a region that is naturally of p-type into an n-type region. FIG. 3 illustrates the functioning of a diode produced in this way. By passing a current in the structure 1 initially of p-type (such as diamond) by means of contact n (contact 7) and contact p (contact 8), it is possible to inject electrons into region 12 of n-type and holes into region 13 of p-type and thereby obtain electroluminescence. Lighting of the diode can be controlled by means of the voltage applied to the gate.

The following results were obtained with a natural n-type GaN structure of $10^{18}/cm^3$ and p-type GaN pad of $10^{16}/cm^3$ with a gate opening 200 nm in diameter. Application of a voltage of −5 V to the gate allows a p-type region to be obtained below the gate, which can be extended as far as 100 nm below the gate. In this region, referenced 10 in FIG. 2, with a current of 1 to 10 mA, good efficiency of radiative combination is then achieved.

Good results can also be obtained when using a heterojunction with a p-type material in the gate opening, of a different type to the material used for the structure. These results were obtained with an n-type GaN structure of $10^{18}/cm^3$ and p-type GaInN pad of $10^{16}/cm^3$ with a gate opening 200 nm in diameter. The percentage of indium in the GaInN is such that the band gap energy is 3.4 eV. With a current of 1 to 10 mA, good radiative recombination efficiency is obtained in the gate vicinity.

To increase recombination efficiency, quantum well structures can be used. The depth of the inverting region can be controlled by the gate voltage which can be adjusted such that the quantum well lies at the p/n junction for example.

Figure 4:
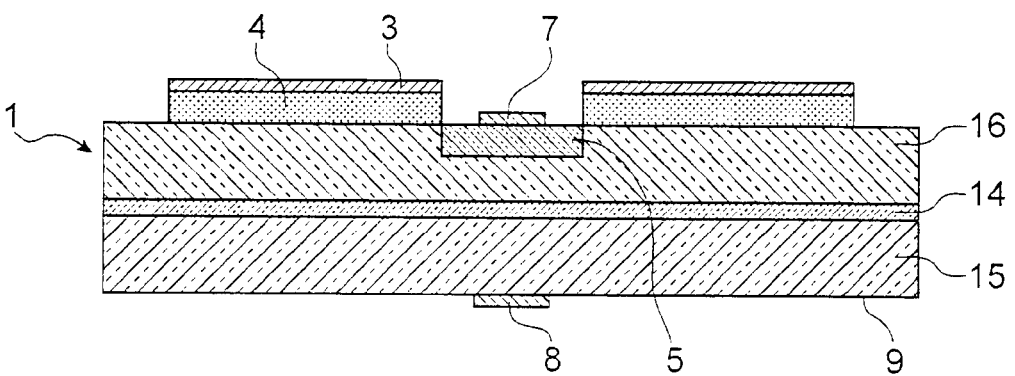
FIG. 4 illustrates the functioning of a third light-emitting diode according to the invention.

FIG. 4 illustrates the functioning of said light-emitting diode. The structure 1 comprises a ZnO region 14 sandwiched between regions 15 and 16 in ZnMgO. The application of a negative voltage to the gate 3 allows inverting of the ZnMgO region 16 naturally of n-type into a p-type region and allows the quantum well 14 to be positioned at the p/n junction.

With the present invention, it is possible to produce light-emitting diodes or LEDs even from semiconductor materials for which n- or p-type doping is difficult.

The invention also enables LED matrices to be produced whose lighting is solely controlled by applying a gate voltage.

The invention claimed is:

1. A light-emitting diode comprising:
    a structure in a semiconductor material of first conductivity type; and
    means for electric polarization of the light-emitting diode, wherein
    the structure has a first face of which a first region, of a same conductivity type as the structure, is in contact with a pad of semiconductor material having a second conductivity type opposite the first conductivity type,
    the means for electric polarization of the light-emitting diode includes,
        a first electric contact on the pad,
        a second electric contact on the first face or on a second face of the structure, and
        a gate in electrically conductive material arranged on a second region of the first face and separated from the first face by an electrically insulating layer, the second region having a same conductivity type as the structure.

2. The light-emitting diode according to claim 1, wherein the gate is a disc having a central hole surrounding said pad.

3. The light-emitting diode according to either of claim 1 or 2, wherein the pad of semiconductor material is housed in a cavity formed from the first face of the structure.

4. The light-emitting diode according to claim 1, wherein the gate is one of gold, copper and platinum.

5. The light-emitting diode according to claim 1, wherein the electrically insulating layer is in $SiO_2$.

6. The light-emitting diode according to claim 1, wherein the first and second electric contacts are in one of gold, copper and platinum.

7. The light-emitting diode of claim 1, wherein the structure in the semiconductor material has a thickness in a range from 100 nm to 50 μm.

8. The light-emitting diode of claim 1, wherein the electrically insulating layer has a thickness in a range from 30 nm to 70 nm.

9. The light-emitting diode of claim 1, wherein the structure of the semiconductor material includes a ZnO region sandwiched between regions of ZnMgO, wherein a voltage applied to the gate electrode causes one of the ZnMgO regions to invert from the first conductivity type to the second conductivity type.

10. The light-emitting diode according to claim 1, wherein the semiconductor material of the first conductivity type is one of ZnO, GaN and GaAs.

11. The light-emitting diode according to claim 10, wherein the semiconductor material of said pad is one of ZnO, GaN, GaInN, GaAs and GaInAs.

12. The light-emitting diode according to claim 1, wherein the semiconductor material of the first conductivity type is diamond.

13. The light-emitting diode according to claim 12, wherein the semiconductor material of said pad is one of MgO, ZnO and ZnMgO.

14. The light-emitting diode according to claim 1, wherein the structure in semiconductor material is a quantum well structure.

15. The light-emitting diode according to claim 14, wherein the structure in semiconductor material is in ZnMgO with a quantum well in ZnO.

16. The light-emitting diode according to either of claim 14 or 15, wherein the polarizing means positions the quantum well at a p/n junction of the light-emitting diode when the light-emitting diode is polarized.

17. A light-emitting diode comprising:
    a structure in a semiconductor material of first conductivity type; and
    means for electric polarization of the light-emitting diode, wherein
    the structure has a first face of which a first region, of a same conductivity type as the structure, is in contact with a pad of semiconductor material having a second conductivity type opposite the first conductivity type,
    the means for electric polarization of the light-emitting diode includes,
        a first electric contact on the pad,
        a second electric contact on the first face or on a second face of the structure, and
        a gate in electrically conductive material arranged on a second region of the first face and separated from the first face by an electrically insulating layer, the second region having a same conductivity type as the structure, and
    the gate is configured to cause an invert polarization of the second region regarding the second electric contact to create an inversion of the conductivity type of the second region and form a light emitting junction with the first region.

* * * * *